(12) United States Patent
Tsumagari et al.

(10) Patent No.: US 10,491,134 B2
(45) Date of Patent: Nov. 26, 2019

(54) ELECTRICAL MACHINE AND POWER CONVERTER

(71) Applicant: KABUSHIKI KAISHA YASKAWA DENKI, Kitakyushu-shi (JP)

(72) Inventors: Ryosuke Tsumagari, Kitakyushu (JP); Tetsuo Yanagimoto, Kitakyushu (JP); Makoto Nakaya, Kitakyushu (JP); Yuki Tokimatsu, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 15/245,181

(22) Filed: Aug. 24, 2016

(65) Prior Publication Data
US 2017/0077832 A1  Mar. 16, 2017

(30) Foreign Application Priority Data

Sep. 11, 2015 (JP) ................................. 2015-180034

(51) Int. Cl.
*H02M 7/00* (2006.01)
*H05K 7/14* (2006.01)

(52) U.S. Cl.
CPC .......... *H02M 7/003* (2013.01); *H05K 7/1432* (2013.01)

(58) Field of Classification Search
CPC ... H02M 7/003; H05K 1/0215; H05K 7/1432; H05K 5/0017
USPC ......................... 361/742, 758, 790, 799, 804
See application file for complete search history.

(56) References Cited

U.S. PATENT DOCUMENTS

| 4,250,616 | A | * | 2/1981 | Klimek | H05K 1/0265 156/267 |
| 5,383,098 | A | * | 1/1995 | Ma | H04B 1/3833 174/371 |
| 5,583,750 | A | | 12/1996 | Nakata et al. | |
| 6,108,214 | A | * | 8/2000 | Fuse | H05K 9/0039 174/125.1 |
| 8,654,541 | B2 | * | 2/2014 | Robert | H01L 23/3735 361/760 |
| 2002/0016092 | A1 | * | 2/2002 | Dibene, II | G06F 1/18 439/74 |

(Continued)

FOREIGN PATENT DOCUMENTS

| CN | 102213883 | 10/2011 |
| JP | 08-125373 | 5/1996 |

(Continued)

OTHER PUBLICATIONS

Japanese Office Action for corresponding JP Application No. 2015-180034, dated Sep. 13, 2016.

(Continued)

*Primary Examiner* — Binh B Tran
*Assistant Examiner* — Douglas R Burtner
(74) *Attorney, Agent, or Firm* — Mori & Ward, LLP (57) ABSTRACT

An electrical machine includes a first substrate, a second substrate, and a conduction support. The first substrate has a mounting surface. The second substrate is disposed in an overlay direction from the first substrate. The conduction support electrically grounds the second substrate and supports the second substrate while keeping approximately no contact with the mounting surface of the first substrate.

26 Claims, 5 Drawing Sheets

(56) References Cited

U.S. PATENT DOCUMENTS

| | | | |
|---|---|---|---|
| 2005/0157051 A1* | 7/2005 | Silverbrook | B41J 2/14427 347/42 |
| 2012/0293428 A1* | 11/2012 | Yan | H01L 27/3232 345/173 |
| 2013/0115789 A1* | 5/2013 | Jackson | H01R 4/34 439/78 |
| 2015/0180316 A1* | 6/2015 | Maeshima | B62D 5/0406 310/71 |
| 2016/0174377 A1* | 6/2016 | Chuah | H05K 1/144 361/784 |
| 2018/0234077 A1* | 8/2018 | Ishimasa | H03H 9/0519 |

FOREIGN PATENT DOCUMENTS

| | | |
|---|---|---|
| JP | 2000-183567 | 6/2000 |
| JP | 2000-318628 | 11/2000 |
| JP | 2002-009413 | 1/2002 |
| JP | 2005-516570 | 6/2005 |
| WO | WO 03/063564 | 7/2003 |
| WO | WO 2014/057622 | 4/2014 |

OTHER PUBLICATIONS

Chinese Office Action for corresponding CN Application No. 201610417529.2, dated Sep. 10, 2018.
Chinese Office Action for corresponding CN Application No. 201610417529.2, dated Jun. 26, 2019.

\* cited by examiner

ELECTRICAL MACHINE AND POWER CONVERTER

CROSS-REFERENCE TO RELATED APPLICATIONS

The present application claims priority under 35 U.S.C. § 119 to Japanese Patent Application No. 2015-180034, filed Sep. 11, 2015. The contents of this application are incorporated herein by reference in their entirety.

BACKGROUND

Field of the Invention

The embodiments disclosed herein relate to an electrical machine and a power converter.

Discussion of the Background

Japanese Unexamined Patent Application Publication No. 2002-9413 discloses a plurality of electronic circuit substrates each having a front surface and a back surface. On the front surface and the back surface, a contactor is disposed. When the plurality of electromagnetic circuit substrates are aligned in parallel to each other, the contactors contact each other to become electrically connected to each other. In this manner, power is supplied between the plurality of electromagnetic circuit substrates, and grounding is performed.

SUMMARY

According to one aspect of the present disclosure, an electrical machine includes a first substrate, a second substrate, and a conduction support. The first substrate has a mounting surface. The second substrate is disposed in an overlay direction from the first substrate. The conduction support electrically grounds the second substrate and supports the second substrate while keeping approximately no contact with the mounting surface of the first substrate.

According to another aspect of the present disclosure, a power converter converts power fed from outside the power converter into control power to drive a motor, and includes an electrical machine. The electrical machine includes a first substrate, a second substrate, and a conduction support. The first substrate has a mounting surface. The second substrate is disposed in an overlay direction from the first substrate. The conduction support electrically grounds the second substrate and supports the second substrate while keeping approximately no contact with the mounting surface of the first substrate.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

In the following description, the terms "frontward", "rearward", "leftward", "rightward", "upward", and "downward" used in relation to the inverter respectively correspond to the arrow-headed directions illustrated in FIG. 1 and other drawings. In this embodiment, these directions are defined according to a typical manner in which the inverter is installed. These directions, however, may vary as where to install the inverter may vary.

Figure 1:
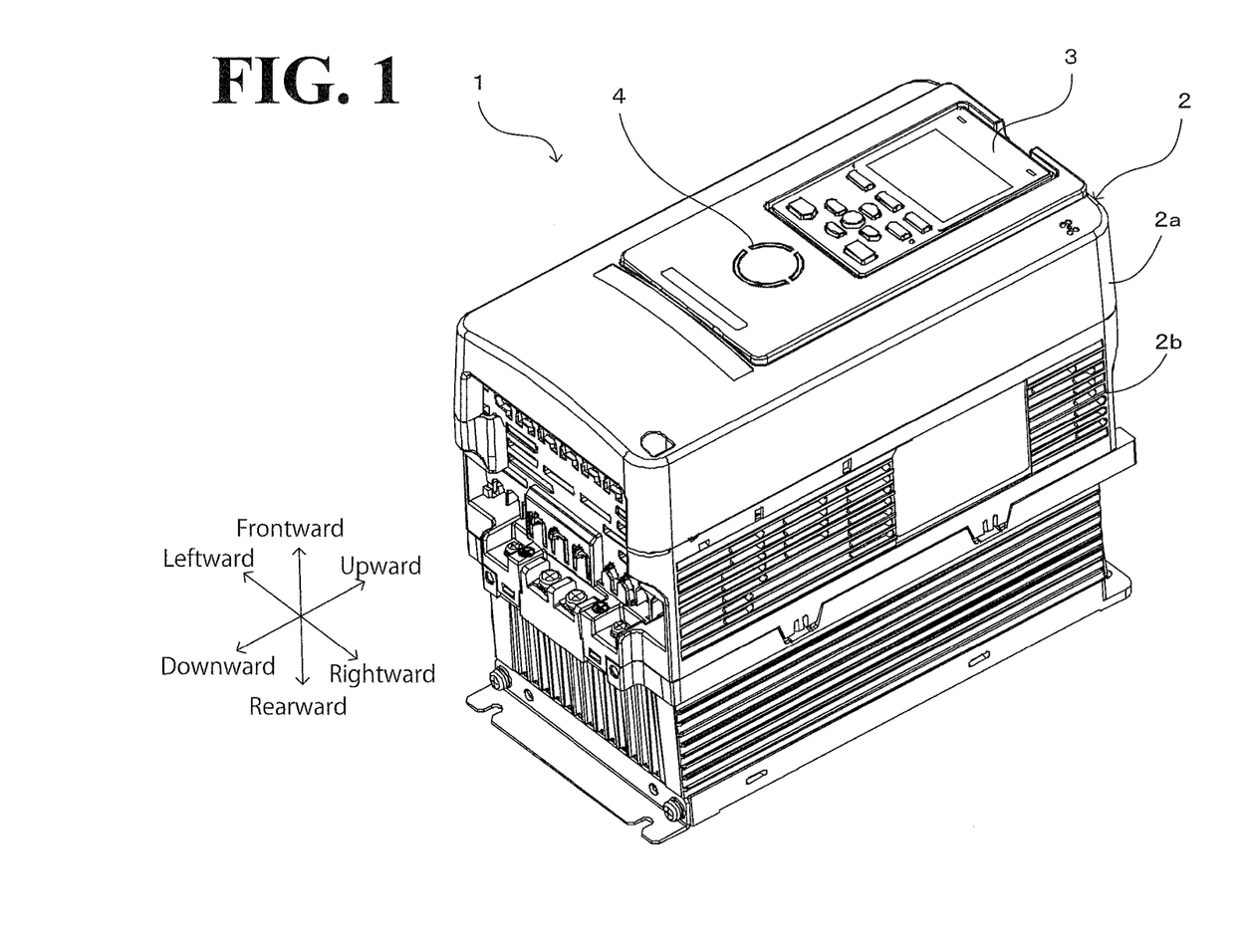
FIG. 1 is a perspective view of an inverter in its complete state, that is, with an electrical machine according to an embodiment being provided in the inverter.

FIG. 1 is a perspective view of an inverter in its complete state implemented by the electrical machine according to this embodiment. Referring to FIG. 1, the inverter 1 is a power conversion apparatus that converts three-phase AC power supplied from outside into drive control power to be input into electric machinery such as a motor, not illustrated. The inverter 1 includes a housing 2, which has an approximately rectangular parallelepiped shape. On the front surface of the housing 2, an operator 3 and an indicator 4 are disposed. The operator 3 serves as a handling section and a display section of the inverter 1. The indicator 4 indicates how the inverter 1 is operating in simplified form.

Figure 2:
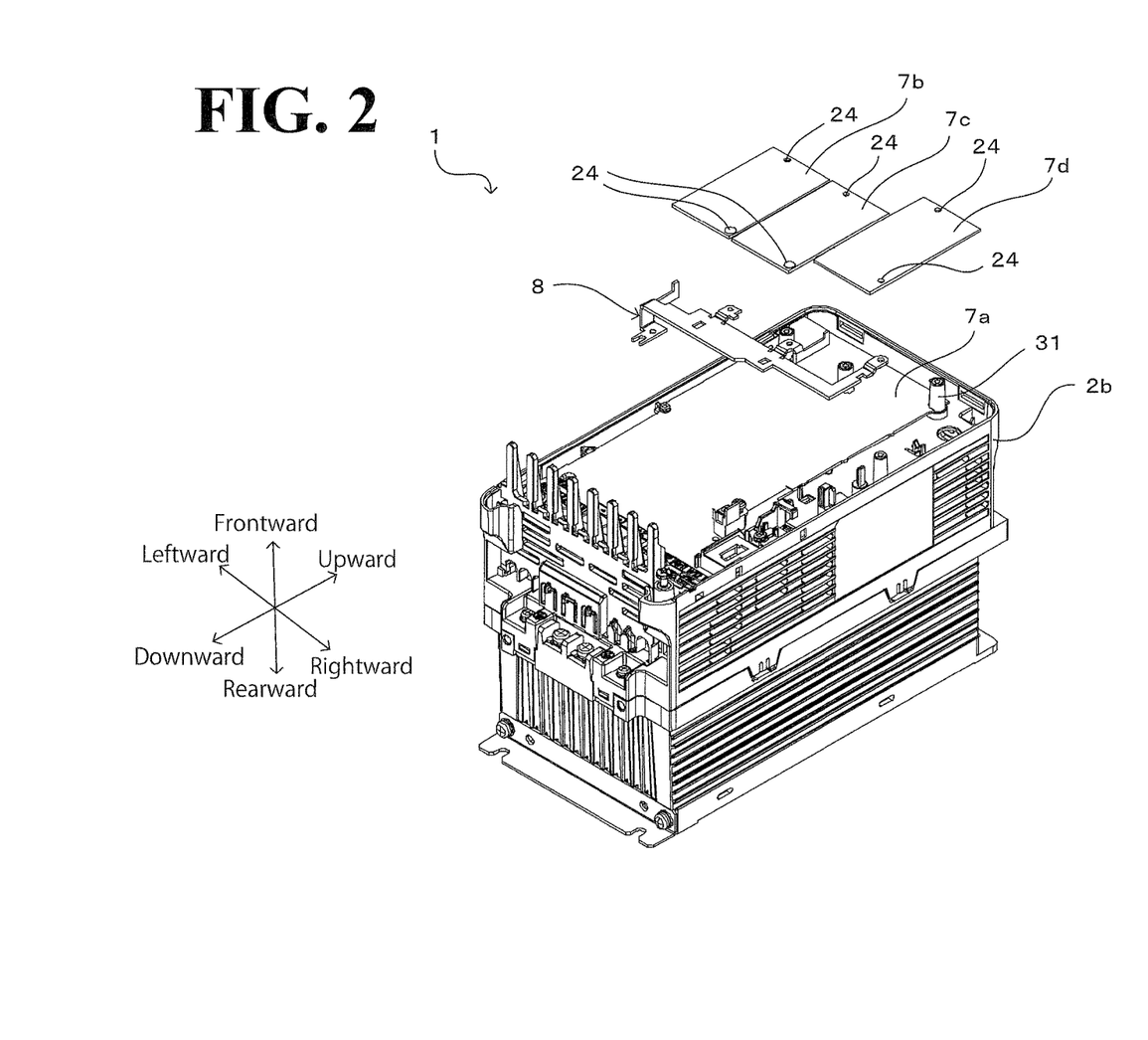
FIG. 2 is a partially exploded perspective view of the inverter.

FIG. 2 is a partially exploded perspective view of the inverter 1. Referring to FIG. 2, the housing 2 of the inverter 1 has an approximately rectangular parallelepiped shape and is dividable in its thickness direction (the frontward and rearward directions) into a lid 2a (which is not illustrated in FIG. 2 but is in FIG. 1) and a housing body 2b. That is, the lid 2a and the housing body 2b are attachable and detachable to and from each other in the thickness direction of the housing 2. The housing 2 houses a plurality of circuit substrates 7 and an earth support bar 8 (which is a non-limiting example of the conduction support recited in the appended claims). In the embodiment illustrated in FIG. 2, the plurality of circuit substrates 7 include a main substrate 7a (which is a non-limiting example of the first substrate recited in the appended claims), a first option substrate 7b, a second option substrate 7c, and a third option substrate 7d (which are non-limiting examples of the second substrate recited in the appended claims). The main substrate 7a has an approximately rectangular shape that has a larger mounting area. The first option substrate 7b, the second option substrate 7c, and the third option substrate 7d each have an approximately rectangular shape that has a length in the upward and downward directions and a smaller mounting area. The main substrate 7a is a printed circuit board on which main control circuits of the inverter 1 are disposed. The option substrates 7b, 7c, and 7d are printed circuit boards on which supplementary control circuits selected by a user are disposed. All the substrates 7 are arranged with their electronic-component loaded surfaces facing in the frontward direction. To avoid complicated illustration, the electronic components mounted on the substrates 7a to 7d are not illustrated.

In the housing body 2b, the main substrate 7a is fixed to the bottom of the housing body 2b, and the three option substrates 7b, 7c, and 7d are aligned in the rightward and leftward directions in parallel to the main substrate 7a. More specifically, the option substrates 7b, 7c, and 7d are arranged at positions that are further frontward than the main substrate 7a and are at a uniform distance from the main substrate 7a. In other words, the option substrates 7b, 7c, and 7d are disposed in the frontward direction (which is a non-limiting example of the overlay direction recited in the appended claims) from the main substrate 7a. That is, the main substrate 7a and the option substrates 7b, 7c, and 7d are arranged in overlay configuration in the frontward direction. This relationship that the main substrate 7a has with the option substrates 7b, 7c, and 7d is maintained by the earth support bar 8 and bosses 31 (see FIG. 5, described later).

In an electrical machine such as the inverter 1, many of its main functional components or elements are mounted on a printed circuit board, and various wires are connected to the printed circuit board to supply power to the printed circuit board and send and receive signals to and from the printed circuit board. One of the wires is a grounding-purpose wire, that is, a wire to secure zero potential for the printed circuit board. In order to save the space that a machine occupies or in order to secure expansibility in the machine, common practice is to arrange a plurality of independent printed circuit boards in overlay configuration, as in the above-described embodiment.

There also has been a growing tendency for smaller-sized electronic components to be mounted on the circuit substrate 7, which in turn causes a growing tendency for higher density of the electronic components with respect to the mounting area of the circuit substrate 7. In order to realize higher density of the electronic components, common practice is to connect two circuit substrates to each other through a column such as a boss. The boss, however, takes up space, causing to decrease the number of electronic components mountable on the circuit substrate 7. Additionally, the assembly work of the electrical machine involves additional, complicated work of connecting the above-described grounding-purpose wires to the two circuit substrates, making the structure of the electrical machine more complicated.

In view of this consideration, this embodiment provides the earth support bar 8. The earth support bar 8 keeps approximately no contact with the mounting surface of the main substrate 7a, and electrically grounds and mechanically supports the option substrates 7b, 7c, and 7d. In this manner, the earth support bar 8 maintains the positional relationship between the main substrate 7a and the option substrates 7b, 7c, and 7d, that is, the main substrate 7a and the option substrates 7b, 7c, and 7d are arranged in overlay configuration.

Figure 3:
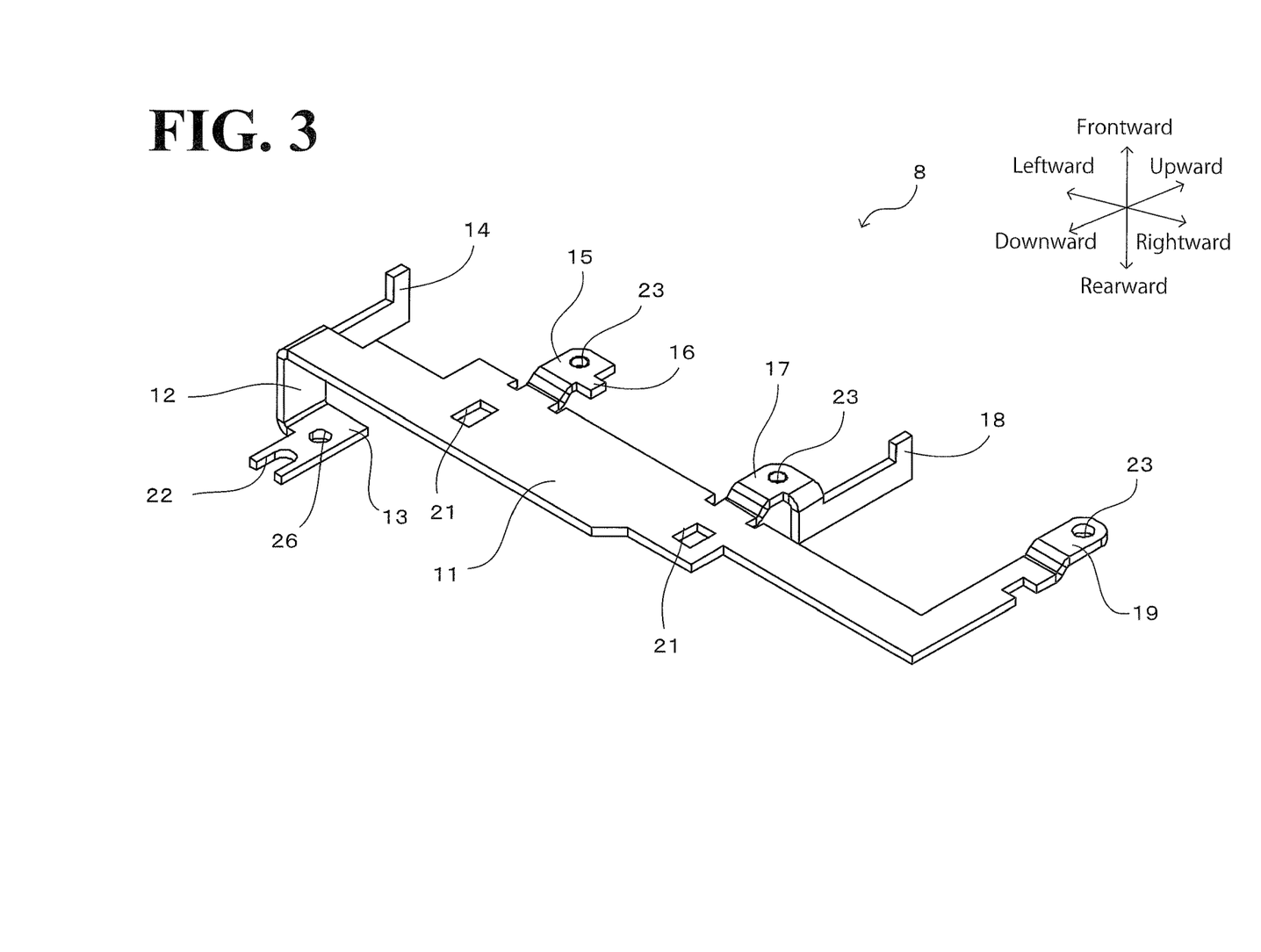
FIG. 3 is a perspective view of an earth support bar.

FIG. 3 is a perspective view of the earth support bar 8. The earth support bar 8 illustrated in FIG. 2 is enlarged in FIG. 3. The earth support bar 8 is made by cutting a conductive metal plate into a predetermined shape and bending the predetermined shape at a plurality of portions into the shape of the earth support bar 8. In the embodiment illustrated in FIG. 3, the earth support bar 8 includes a bar body 11, a leg 12, a fixing portion 13, a first substrate contact portion 14, a first substrate support 15, a second substrate contact portion 16, a second substrate support 17, a third substrate contact portion 18, and a third substrate support 19. The bar body 11 extends in the rightward and leftward directions. The leg 12 extends in the rearward direction from the left end of the bar body 11. The fixing portion 13 is connected with the rear end of the leg 12. The first substrate contact portion 14 extends in the upward direction from the leg 12. The first substrate support 15 extends in the upward direction from a position slightly to the left from the center of the bar body 11. The second substrate contact portion 16 extends in the rightward direction from the first substrate support 15. The second substrate support 17 extends in the upward direction from a position slightly to the right from the center of the bar body 11. The third substrate contact portion 18 extends in the upward direction from the second substrate support 17. The third substrate support 19 extends in the upward direction from the right end of the bar body 11.

The bar body 11 (which is a non-limiting example of the body recited in the appended claims) is approximately strip-shaped with its length in the rightward and leftward directions slightly greater than the width of the main substrate 7a in the rightward and leftward directions. An LED receiving hole 21 is disposed adjacent to the first substrate support 15, and another LED receiving hole 21 is disposed adjacent to the second substrate support 17. Each LED receiving hole 21 receives an LED substrate, described later.

The fixing portion 13 includes a bar positioning hole 26 and an approximately U-shaped bar fixing groove 22. The fixing portion 13 is the only portion of the earth support bar 8 that faces the rear surface (rearward side) of the main substrate 7a. The positioning of the earth support bar 8 is performed by fitting the bar positioning hole 26 with a protrusion (not illustrated) formed on a bottom surface provided in the housing body 2b. With the bar positioning hole 26 fitted with the protrusion, a screw is inserted through the bar fixing groove 22 and the main substrate 7a, and then fastened. In this manner, the earth support bar 8 is fixed to the inside of the housing 2. The fixing portion 13 is held between the main substrate 7a and the bottom surface provided in the housing body 2b. By making the screw loose, the bar fixing groove 22 can be removed from the screw, and the earth support bar 8 alone can be removed from the housing 2 (this removal operation is not illustrated).

The first substrate contact portion 14 and the third substrate contact portion 18 each have an approximately L shape with its leading end (upward end) bent in the forward direction. The first substrate contact portion 14 contacts, at its frontward end, the rearward surface of the first option substrate 7b to support the first option substrate 7b. The third substrate contact portion 18 contacts, at its frontward end, the rearward surface of the third option substrate 7d to support the third option substrate 7d. The second substrate contact portion 16, at its frontward end, the rearward surface of the second option substrate 7c to support the second option substrate 7c.

The first substrate support 15, the second substrate support 17, and the third substrate support 19 are bent in the frontward direction to be slightly offset from the bar body 11. In the first substrate support 15, the second substrate support 17, and the third substrate support 19, substrate fixing holes 23 are disposed to receive screws that fix the option substrates 7b, 7c, and 7d.

Figure 4:
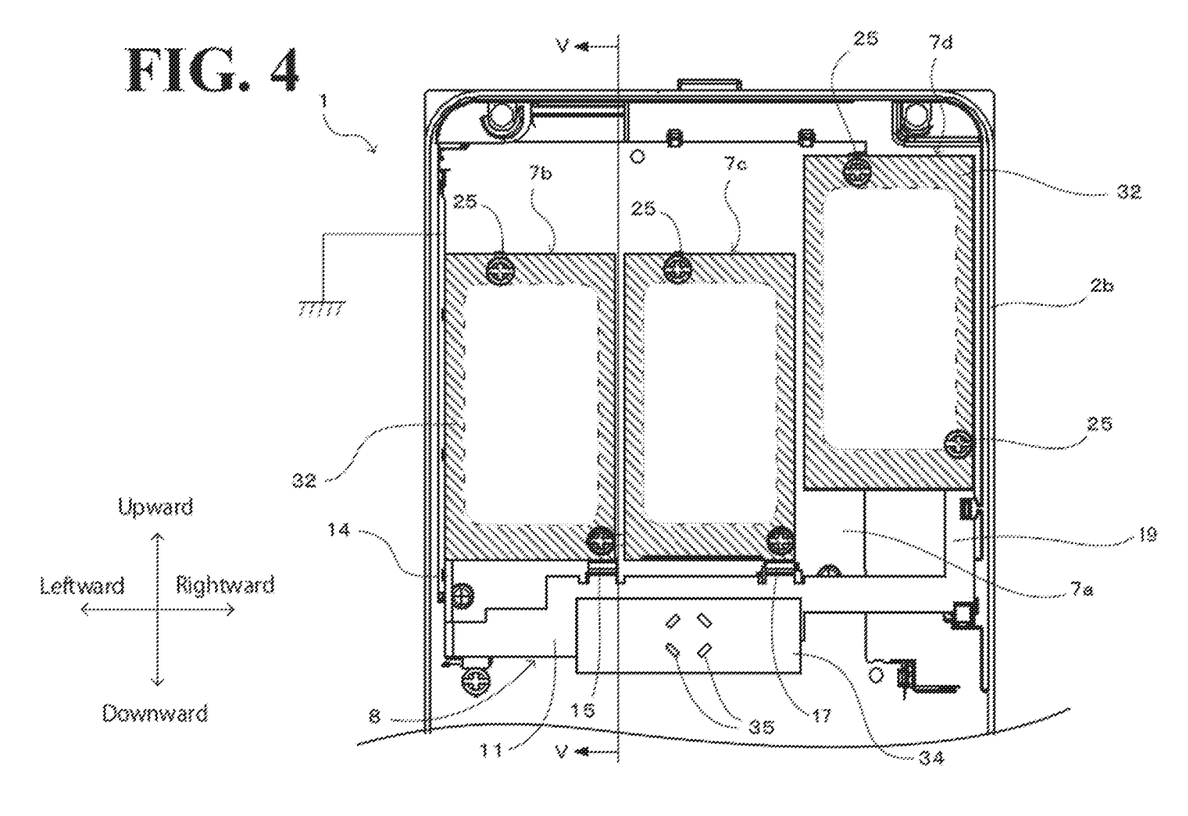
FIG. 4 is a front view of the inverter with its lid removed illustrating how option substrates are arranged.
Figure 5:
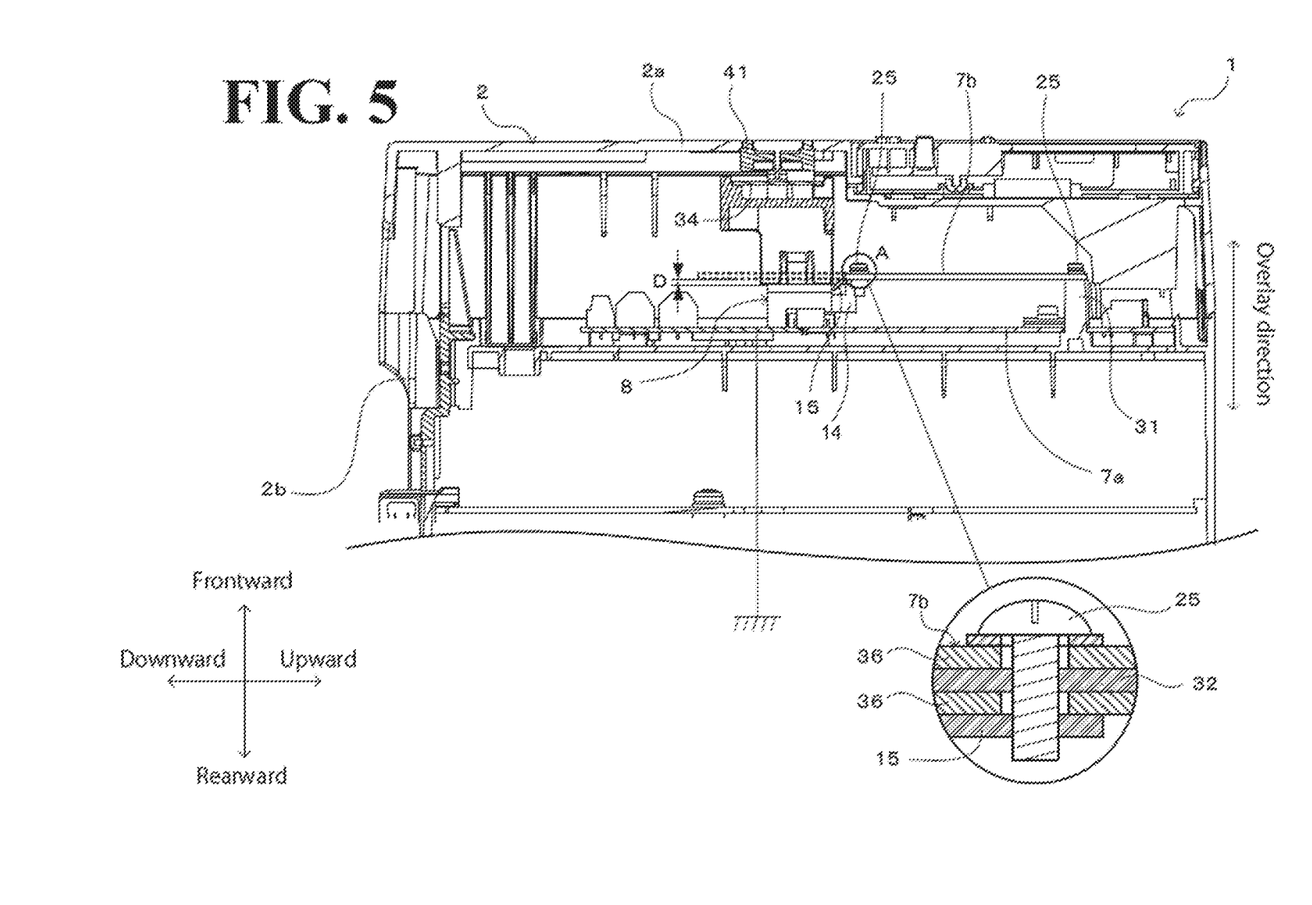
FIG. 5 is a longitudinal cross-section of the inverter taken along the line V-V illustrated in FIG. 4.

FIG. 4 is a front view of the inverter 1 with the lid 2a removed illustrating how the option substrates 7b, 7c, and 7d are arranged. FIG. 5 is a longitudinal cross-section of the inverter 1 taken along the line V-V illustrated in FIG. 4. Referring to FIGS. 4 and 5, the bar body 11 of the earth support bar 8 crosses the main substrate 7a in the rightward and leftward directions and is arranged at a position that is further frontward than the main substrate 7a and that is at a uniform distance from the main substrate 7a. No portions of the earth support bar 8, including the leg 12, are in contact with the main substrate 7a. The fixing portion 13 faces the rear surface (rearward side) of the main substrate 7a, and as described above, is fixed between the bottom of the housing body 2b and the rear surface of the main substrate 7a by the screw passed through the bar fixing groove 22.

Screw holes 24 are disposed adjacent to the upward edge and the downward edge of each of the option substrates 7b, 7c, and 7d (see FIG. 2). The screw holes 24 receive screws 25 so that the screws 25 passed through the screw holes 24 adjacent to the upward edges of the option substrates 7b, 7c, and 7*d* are fitted with the bosses 31 of the housing body 2*b* while the screws 25 (which are non-limiting examples of the connection member recited in the appended claims) passed through the screw holes 24 adjacent to the downward edges of the option substrates 7*b*, 7*c*, and 7*d* are fitted with the substrate fixing holes 23, which are disposed on the substrate supports 15, 17, and 19 of the earth support bar 8. In this configuration, the substrate fixing holes 23 of the substrate supports 15, 17, and 19 communicate with the screw holes 24 adjacent to the downward edges of the option substrates 7*b*, 7*c*, and 7*d*, and the frontward surfaces of the substrate supports 15, 17, and 19 have surface contact with the rearward surfaces of the corresponding option substrates 7*b*, 7*c*, and 7*d*. The leading ends of the substrate contact portions 14, 16, and 18 contact and support the rearward surfaces of the corresponding option substrates 7*b*, 7*c*, and 7*d*. The bosses 31 are columns extending from the bottom of the housing body 2*b* to penetrate the main substrate 7*a* and extend in the frontward direction. The leading ends of the bosses 31 contact and support the rearward surfaces of the corresponding option substrates 7*b*, 7*c*, and 7*d*. Thus, the option substrates 7*b*, 7*c*, and 7*d* are supported by the bosses 31 of the housing body 2*b* at the upward edges of the option substrates 7*b*, 7*c*, and 7*d*, and supported by the earth support bar 8 at the downward edges of the option substrates 7*b*, 7*c*, and 7*d*.

In this embodiment, each of the option substrates 7*b*, 7*c*, and 7*d* has such a structure that two insulation layers 36 hold between them an earth pattern 32, which is a conductor thin plate. This structure is illustrated in the enlarged cross-section of portion A illustrated in FIG. 5. The cross-section is a longitudinal cross-section parallel to the axis of the screw 25. The earth pattern 32 is disposed in the hatched regions as seen through the lid in FIG. 4. The hatched regions are forbidden regions where no electronic components are provided (the hatched regions, however, are not intended as limiting where to provide the earth pattern 32). The substrate support 15 of the earth support bar 8 coincides with the region of the earth pattern 32 of the option substrate 7*b*. The substrate support 17 of the earth support bar 8 coincides with the region of the earth pattern 32 of the option substrate 7*c*. The substrate support 19 of the earth support bar 8 coincides with the region of the earth pattern 32 of the option substrate 7*d*. This configuration ensures that the screws 25 passed through the screw holes 24 adjacent to the downward edges of the option substrates 7*b*, 7*c*, and 7*d* electrically connect the earth patterns 32 to the substrate supports 15, 17, and 19 of the earth support bar 8. The fixing portion 13 of the earth support bar 8 is electrically connected with the earth pattern (not illustrated) of the main substrate 7*a*, making the earth support bar 8 and the earth pattern of the main substrate 7*a* electrically grounded. This configuration ensures that the earth patterns 32 of the option substrates 7*b*, 7*c*, and 7*d* are electrically grounded through the common earth support bar 8 and the main substrate 7*a*. In another possible embodiment, not illustrated, the earth patterns 32 may be arranged on the rearward surfaces of the option substrates 7*b*, 7*c*, and 7*d*, and the substrate supports 15, 17, and 19 of the earth support bar 8 may have direct surface contact with the corresponding earth patterns 32. This possible embodiment also ensures the above-described grounding. In still another possible embodiment, not illustrated, the main substrate 7*a* may be directly connected with a grounding-purpose wire, without intervention by the earth support bar 8, so as to implement the above-described grounding.

Thus, the option substrates 7*b*, 7*c*, and 7*d* are grounded through the common one earth support bar 8 (and the main substrate 7*a*). This configuration eliminates the need for grounding the option substrates 7*b*, 7*c*, and 7*d* individually using different grounding-purpose wires. Also in the above-described configuration, the downward edges of the option substrates 7*b*, 7*c*, and 7*d* are mechanically supported by the earth support bar 8, instead of by the bosses 31. This reduces the number of necessary bosses 31 while keeping the option substrates 7*b*, 7*c*, and 7*d* in place relative to the main substrate 7*a*. The earth support bar 8 is a non-limiting example of the means for electrically grounding the second substrate and supporting the second substrate while keeping approximately no contact with the first substrate, recited in the appended claims.

To the frontward surface of the bar body 11 of the earth support bar 8, an LED substrate 34 (third substrate) is fixed through brackets fitted with the LED receiving holes 21. The LED substrate 34 includes four LEDs 35. The LEDs 35 are optical sources of the indicator 4 of the lid 2*a*. Specifically, in a certain operation status of the main substrate 7*a* and the option substrates 7*b*, 7*c*, and 7*d*, the LEDs 35 emit light that is guided through a transparent material 41 and causes the indicator 4 to light.

Advantageous Effects of this Embodiment

As has been described hereinbefore, the inverter 1 according to this embodiment includes the earth support bar 8. The earth support bar 8 keeps approximately no contact with the mounting surface of the main substrate 7*a*. The earth support bar 8 also electrically grounds and mechanically supports the option substrates 7*b*, 7*c*, and 7*d* while keeping the main substrate 7*a* and the option substrates 7*b*, 7*c*, and 7*d* arranged in overlay configuration. This configuration ensures that the earth support bar 8 can be used to ground the option substrates 7*b*, 7*c*, and 7*d*, eliminating the need for grounding-purpose wires to individually connect the option substrates 7*b*, 7*c*, and 7*d*. The above configuration also reduces the number of necessary bosses 31 while keeping the main substrate 7*a* and the option substrates 7*b*, 7*c*, and 7*d* arranged in overlay configuration. This configuration, in turn, increases the number of electronic components mountable on the main substrate 7*a*, resulting in improved functions and size reductions.

As used herein, the earth support bar 8's "keeping substantially no contact with the mounting surface of the main substrate 7*a*" means that the earth support bar 8 has no or minimal influence on the number of electronic components mountable on the mounting surface of the main substrate 7*a*. Insofar as the earth support bar 8 has no or minimal influence on the number of electronic components mountable on the mounting surface of the main substrate 7*a*, other configurations are possible than the above-described embodiment, in which the fixing portion 13 is the only portion of the earth support bar 8 that contacts the mounting surface of the main substrate 7*a*, with the other portions of the earth support bar 8 kept completely non-contact. Another possible configuration is that any of the other portions of the earth support bar 8 has some level of contact with the mounting surface of the main substrate 7*a* that causes no substantial influence on the electronic components on the mounting surface of the main substrate 7*a*.

Also in this embodiment, the earth support bar 8 is fixed to the housing 2, which houses the main substrate 7*a* and the option substrates 7*b*, 7*c*, and 7*d*. This configuration ensures that the option substrates 7b, 7c, and 7d are reliably supported and fixed without influencing the mounting area of the main substrate 7a.

Also in this embodiment, the earth support bar 8 is disposed across the main substrate 7a. In other words, the earth support bar 8 is disposed over the mounting surface of the main substrate 7a. This arrangement enables the earth support bar 8 to function as a noise shield for the main substrate 7a.

Also in this embodiment, the earth support bar 8 is electrically connected with the earth patterns 32 of the option substrates 7b, 7c, and 7d through the screws 25, which are connection members. This configuration simplifies the configurations of the substrate supports 15, 17, and 19, resulting in facilitated mounting work, and also ensures reliable electrical connection between the earth patterns 32 and the earth support bar 8 through the screws 25.

Also in this embodiment, the earth support bar 8 supports the option substrates 7b, 7c, and 7d at a position that is offset from the bar body 11 in the overlay direction (in the frontward direction). This configuration eliminates or minimizes bending of the option substrates 7b, 7c, and 7d. Also, even in such an embodiment that the option substrates 7b, 7c, and 7d are arranged over the bar body 11, a gap of D, which is equivalent to the above-described offset, is secured between the bar body 11 and the wiring patterns between the electronic components. Securing the gap D eliminates or minimizes contact between the bar body 11 and the option substrates 7b, 7c, and 7d (see the broken lines illustrated in FIG. 5).

Also in this embodiment, the earth support bar 8 includes the substrate contact portions 14, 16, and 18. The substrate contact portions 14, 16, and 18 each have an L shape and are in contact with the rearward surfaces of the option substrates 7b, 7c, and 7d. In this configuration, the substrate contact portions 14, 16, and 18 respectively contact and support the option substrates 7b, 7c, and 7d at the leading ends of the substrate contact portions 14, 16, and 18. This ensures more reliable support for the option substrates 7b, 7c, and 7d while preventing the mounting area of the option substrates 7b, 7c, and 7d from diminishing.

Also in this embodiment, the earth support bar 8 electrically grounds the plurality of option substrates 7b, 7c, and 7d and supports the option substrates 7b, 7c, and 7d. In other words, the plurality of option substrates 7b, 7c, and 7d are supported and grounded by the single earth support bar 8. This configuration simplifies the entire structure and reduces its piece-part count. In another possible embodiment, not illustrated, the plurality of circuit substrates 7 may include any one of the option substrates 7b, 7c, and 7d alone. This another possible embodiment provides advantageous effects similar to the advantageous effects provided in the above-described embodiment.

In still another possible embodiment, not illustrated, the earth support bar 8 (and the earth pattern 32) may be arranged at positions to support and ground the upward edges of the option substrates 7b, 7c, and 7d. In still another possible embodiment, not illustrated, two earth support bars 8 (and the earth patterns 32) may be arranged at positions to support and ground the upward edges and downward edges of the option substrates 7b, 7c, and 7d. In the still another possible embodiment where the plurality of earth support bars 8 support and ground the option substrates 7b, 7c, and 7d, the number of necessary bosses 31 is further reduced. This configuration, in turn, increases the number of electronic components mountable on the main substrate 7a, and enables the option substrates 7b, 7c, and 7d to be grounded more reliably.

Also in the above-described embodiment, the earth support bar 8 supports the LED substrate 34. The LED substrate 34 includes the LEDs 35 to display an operation status of the main substrate 7a or the option substrates 7b, 7c, and 7d. Because of the possession of the LEDs 35 for status indication purposes, the LED substrate 34 needs to be arranged at a special position different from the positions of the main substrate 7a and the option substrates 7b, 7c, and 7d. The above-described embodiment takes this situation into consideration and makes the earth support bar 8 support the LED substrate 34. This configuration enables the LED substrate 34 to be arranged at any position different from the positions of the other circuit substrates 7.

Also in the above-described embodiment, it is the inverter 1 that includes the above-described configuration in which the plurality of circuit substrates 7 are arranged in overlay configuration. The inverter 1 converts externally fed power into drive control power for motors. The earth support bar 8 finds applications in such inverter 1, in which the plurality of circuit substrates 7 are arranged in overlay configuration.

Otherwise, the above-described embodiments and modifications may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. An electrical machine comprising:
    a first substrate comprising a mounting surface;
    a second substrate disposed in an overlay direction from the first substrate; and
    a conduction support electrically grounding the second substrate and supporting the second substrate while keeping substantially no contact with the mounting surface of the first substrate by having no contact with the mounting surface of the first substrate, or by having contact with the mounting surface of the first substrate only at a fixing portion of the conduction support, the conduction support extending beyond the first substrate in a frontward direction aligned with the overlay direction and beyond the second substrate in a rearward direction opposite to the frontward direction, the frontward direction and the rearward direction being orthogonal to the mounting surface of the first substrate and a mounting surface of the second substrate,
    wherein the conduction support is disposed across the first substrate and provided on a back surface of the second substrate, which is opposite to the mounting surface of the second substrate, to support the second substrate,
    wherein the mounting surface of the second substrate is smaller in area than the mounting surface of the first substrate,
    wherein the conduction support has a body and a contact portion connected to the body, the contact portion being configured to contact the second substrate, and
    wherein the fixing portion is connected to the body only by a leg that extends from the body toward the mounting surface of the first substrate in a single plane that is parallel to the overlay direction.

2. The electrical machine according to claim 1, wherein the conduction support is fixed to a housing in which the first substrate and the second substrate are disposed.

3. The electrical machine according to claim 1, wherein the conduction support is electrically connected with an earth pattern of the second substrate through a connection member.

4. The electrical machine according to claim 1, wherein the conduction support supports the second substrate at a position offset from a body of the conduction support in the overlay direction.

5. The electrical machine according to claim 1, wherein the conduction support comprises a substrate contact portion comprising an L shape contacting the second substrate.

6. An electrical machine comprising:
a first substrate comprising a mounting surface;
a second substrate disposed in an overlay direction from the first substrate; and
a conduction support electrically grounding the second substrate and supporting the second substrate while keeping substantially no contact with the mounting surface of the first substrate by having no contact with the mounting surface of the first substrate, or by having contact with the mounting surface of the first substrate only at a fixing portion of the conduction support, the conduction support extending beyond the first substrate in a frontward direction aligned with the overlay direction and beyond the second substrate in a rearward direction opposite to the frontward direction, the frontward direction and the rearward direction being orthogonal to the mounting surface of the first substrate and a mounting surface of the second substrate,
wherein the conduction support is disposed across the first substrate and provided on a back surface of the second substrate, which is opposite to the mounting surface of the second substrate, to support the second substrate,
wherein the mounting surface of the second substrate is smaller in area than the mounting surface of the first substrate, and
further comprising a plurality of second substrates including the second substrate,
wherein the conduction support electrically grounds the plurality of second substrates and supports the plurality of second substrates.

7. The electrical machine according to claim 1,
wherein the conduction support comprises a plurality of substrate support portions, the plurality of substrate support portions extending beyond the first substrate in the frontward direction aligned with the overlay direction and beyond the second substrate in the rearward direction opposite to the frontward direction, and
wherein the second substrate is supported by the plurality of substrate support portions.

8. The electrical machine according to claim 1, wherein the conduction support supports a third substrate comprising an LED display indicating an operation status of at least one substrate among the first substrate and the second substrate.

9. A power converter to convert power fed from outside the power converter into control power to drive a motor, the power converter comprising an electrical machine, the electrical machine comprising:
a first substrate comprising a mounting surface;
a second substrate disposed in an overlay direction from the first substrate; and
a conduction support electrically grounding the second substrate and supporting the second substrate while keeping substantially no contact with the mounting surface of the first substrate by having no contact with the mounting surface of the first substrate, or by having contact with the mounting surface of the first substrate only at a fixing portion of the conduction support, the conduction support extending beyond the first substrate in a frontward direction aligned with the overlay direction and beyond the second substrate in a rearward direction opposite to the frontward direction, the frontward direction and the rearward direction being orthogonal to the mounting surface of the first substrate and a mounting surface of the second substrate,
wherein the conduction support is disposed across the first substrate and provided on a back surface of the second substrate, which is opposite to the mounting surface of the second substrate, to support the second substrate,
wherein the mounting surface of the second substrate is smaller in area than the mounting surface of the first substrate,
wherein the conduction support has a body and a contact portion connected to the body, the contact portion being configured to contact the second substrate, and
wherein the fixing portion is connected to the body only by a leg that extends from the body toward the mounting surface of the first substrate in a single plane that is parallel to the overlay direction.

10. The electrical machine according to claim 2, wherein the conduction support is electrically connected with an earth pattern of the second substrate through a connection member.

11. The electrical machine according to claim 4, wherein the conduction support is electrically connected with an earth pattern of the second substrate through a connection member.

12. The electrical machine according to claim 2, wherein the conduction support supports the second substrate at a position offset from a body of the conduction support in the overlay direction.

13. The electrical machine according to claim 5, wherein the conduction support supports the second substrate at a position offset from a body of the conduction support in the overlay direction.

14. The electrical machine according to claim 3, wherein the conduction support supports the second substrate at a position offset from a body of the conduction support in the overlay direction.

15. The electrical machine according to claim 10, wherein the conduction support supports the second substrate at a position offset from a body of the conduction support in the overlay direction.

16. The electrical machine according to claim 11, wherein the conduction support supports the second substrate at a position offset from a body of the conduction support in the overlay direction.

17. The electrical machine according to claim 2, wherein the conduction support comprises a substrate contact portion comprising an L shape contacting the second substrate.

18. The electrical machine according to claim 3, wherein the conduction support comprises a substrate contact portion comprising an L shape contacting the second substrate.

19. An electrical machine comprising:
a first substrate;
a second substrate disposed in an overlay direction from the first substrate; and
means for electrically grounding the second substrate and supporting the second substrate while keeping substantially no contact with the first substrate by having no contact with a mounting surface of the first substrate, or by having contact with the mounting surface of the first substrate only at a fixing portion of the means for electrically grounding the second substrate, the means for electrically grounding the second substrate extending beyond the first substrate in a frontward direction aligned with the overlay direction and beyond the second substrate in a rearward direction opposite to the frontward direction, the frontward direction and the rearward direction being orthogonal to the mounting surface of the first substrate and a mounting surface of the second substrate, wherein the means for electrically grounding the second substrate is disposed across the first substrate and provided on a back surface of the second substrate, which is opposite to the mounting surface of the second substrate, to support the second substrate, wherein the mounting surface of the second substrate is smaller in area than the mounting surface of the first substrate, wherein the means for electrically grounding the second substrate has a body and a contact portion connected to the body, the contact portion being configured to contact the second substrate, and wherein the fixing portion is connected to the body only by a leg that extends from the body toward the mounting surface of the first substrate in a single plane that is parallel to the overlay direction.

20. The electrical machine according to claim 1, further comprising:
   a lid attachable to and detachable from a housing,
   wherein the conduction support supports the second substrate such that the second substrate is closer to the lid than to the first substrate.

21. The electrical machine according to claim 1, wherein the conduction support is formed by a single plate including a plurality of substrate support portions.

22. The electrical machine according to claim 21, further comprising
   a plurality of second substrates including the second substrate,
   wherein the plurality of substrate support portions electrically grounds the plurality of second substrates and supports the plurality of second substrates.

23. The power converter according to claim 9, further comprising:
   a lid attachable to and detachable from a housing,
   wherein the conduction support supports the second substrate such that the second substrate is closer to the lid than to the first substrate.

24. The power converter according to claim 9, wherein the conduction support is formed by a single plate including a plurality of substrate support portions.

25. The power converter according to claim 24, further comprising
   a plurality of second substrates including the second substrate,
   wherein the plurality of substrate support portions electrically grounds the plurality of second substrates and supports the plurality of second substrates.

26. The electrical machine according to claim 1, wherein the fixing portion comprises:
   one and only one positioning hole for a fastener.

* * * * *